US007640656B2

(12) United States Patent
Chen

(10) Patent No.: US 7,640,656 B2
(45) Date of Patent: Jan. 5, 2010

(54) METHOD FOR MANUFACTURING A PRE-MOLDING LEADFRAME STRIP WITH COMPACT COMPONENTS

(75) Inventor: Jau-Shyong Chen, Chang Hua (TW)

(73) Assignee: SDI Corporation, Chang Hua (TW)

( * ) Notice: Subject to any disclaimer, the term of this patent is extended or adjusted under 35 U.S.C. 154(b) by 209 days.

(21) Appl. No.: 11/893,778

(22) Filed: Aug. 16, 2007

(65) Prior Publication Data

US 2009/0044402 A1 Feb. 19, 2009

(51) Int. Cl.
*H05K 3/10* (2006.01)
*H01L 21/00* (2006.01)

(52) U.S. Cl. ............................. 29/832; 29/827; 29/833; 29/840; 438/123; 438/124

(58) Field of Classification Search ........... 29/825-830, 29/832, 833, 840; 438/123, 124
See application file for complete search history.

(56) References Cited

U.S. PATENT DOCUMENTS

| | | | | |
|---|---|---|---|---|
| 6,143,981 | A * | 11/2000 | Glenn | 174/534 |
| 6,798,047 | B1 * | 9/2004 | Miks et al. | 257/666 |
| 6,833,609 | B1 * | 12/2004 | Fusaro et al. | 257/668 |
| 6,835,599 | B2 * | 12/2004 | Kuan et al. | 438/111 |
| 6,841,414 | B1 * | 1/2005 | Hu et al. | 438/106 |
| 6,858,470 | B1 * | 2/2005 | Han et al. | 438/112 |
| 7,102,214 | B1 * | 9/2006 | Miks et al. | 257/670 |
| 2005/0077623 | A1 * | 4/2005 | Roberts et al. | 257/724 |
| 2005/0236644 | A1 * | 10/2005 | Getten et al. | 257/106 |
| 2008/0230880 | A1 * | 9/2008 | Ano et al. | 257/675 |
| 2008/0254556 | A1 * | 10/2008 | Chew | 438/26 |

* cited by examiner

*Primary Examiner*—C. J Arbes
(74) *Attorney, Agent, or Firm*—William E. Pelton, Esq.; Cooper & Dunham LLP

(57) ABSTRACT

A method for manufacturing a pre-molding leadframe strip with compact components is disclosed. The method forms a leadframe strip with an array of component regions, each component region including two metal parts for using as a chip-attached portion, a wire-bonded portion and two external electrical connection conductors. Next, the leadframe strip is plated with a metal layer having high conductivity and die bonding adhesion. Finally, a pre-molded structure on each of the component regions is formed to surround all the other portions of the leadframe strip with an exception of only the two external electrical connection conductors through a multiplicity of pre-molding processes, each pre-molding process molding the leadframe strip at an interval of one or more than one component regions.

10 Claims, 13 Drawing Sheets

METHOD FOR MANUFACTURING A PRE-MOLDING LEADFRAME STRIP WITH COMPACT COMPONENTS

BACKGROUND OF THE INVENTION

1. Field of the Invention

The present invention relates to a method for manufacturing a pre-molding leadframe strip, and more particularly, to a method for manufacturing a pre-molding leadframe strip with compact components. The disclosure of the present invention can be applied to a surface-mountable electronic component, such as, but not limited to, light-emitting diodes.

2. Description of the Prior Art

As well known to those skilled in the art, a light-emitting diode composed of a compound semiconductor, such as GaAs, AlGaAs, GaN, InGaN or AlGaInP, as a light-emitting source, is a semiconductor device capable of emitting light of various colors.

With great advances in semiconductor techniques, light-emitting diode devices have been produced to have high luminance and quality characteristics. In addition, fabrication of blue and white diodes has been practically realized, whereby the light-emitting diodes are widely applicable to displays, next-generation lighting sources and the like. Besides, a surface mountable light-emitting diode device is available.

In order to expand the areas of use and in order to reduce production costs, attempts are being made to produce electronic components of ever smaller structural sizes and to arrange more components in a certain area. By way of example, the backlighting of the keys of mobile telephones requires very small light-emitting diodes.

A further compactness of the devices is desirable, but is extremely difficult using conventionally available processes. FIGS. 1*a* through 1*c* are top views illustrating a manufacturing process of a conventional pre-molding leadframe strip. As shown in FIG. 1*a*, a leadframe strip 10 with an array of component regions 22*a* is formed for supporting light-emitting diode chips by punching out the leadframe strip 10 from a metal sheet or a foil. Each component region 22*a* includes two metal parts 24*a* and 26*a* for mounting a light-emitting diode chip thereon, and comprises a wire-bonded portion and an external electrical connection as well as two empty spaces 28*a*.

The leadframe strip 10 is then plated with a metal layer 20 having high conductivity and die bonding adhesion, as shown in FIG. 1*b*.

An array of pre-molded structures 42*a* are formed to surround portions of the leadframe strip 10 with the exception of only electrode portions to be used as the external lead electrodes by means of a pre-molding process, as shown in FIG. 1*c*. The conventional pre-molding process is a single step cold runner process and implemented with a sprue 30 and multiple forked runners 32. Each of the pre-molded structures 42*a* formed by the pre-molding process is in the form of polyhedron having an inner cavity to easily mount a desirable target therein, in which a surface facing the component region 22*a* is opened. FIG. 2 shows the detailed pre-molded structure 42*a* and the resulted component region 22*a*. The finished component region 22*a* includes a function area 48*a* composed of the chip-attached portion 47*a* and the wire-bonded portion 49*a*, the pre-molded structures 42*a*, the empty spaces 28*a* and two exposed external electrode portions 44*a* and 46*a*. The external electrode portions 44*a* and 46*a* of the component region 22*a* will then be folded to make mountable electrode structures during subsequent packaging processes.

However, such a conventional pre-molding process is disadvantageous in terms of lower throughput as well as leadframe and molding material waste, resulting from loose arrangement of effective component regions caused by space required by forked runners in a single injection molding process. As can be seen in FIGS. 1*a* through 1*c*, the conventional pre-molded process is low in mass production efficiency, since a density of the component regions is limited by the single pre-molding process. Moreover, use of such a single pre-molding process means the actual area occupied by the components is very low, thus significantly lowering utilization of precious materials.

SUMMARY OF THE INVENTION

An objective of the present invention is to solve the above-mentioned problems and to provide a method for manufacturing a pre-molding leadframe strip with compact components that has much better materials utilization and mass production efficiency, characterized by compact components arrangement formed by a multiplicity of pre-molding processes with hot runners.

The present invention achieves the above-indicated objective by providing a method for manufacturing a pre-molding leadframe strip with compact components by first forming a leadframe strip with an array of component regions, each component region including two metal parts for using as a chip-attached portion, a wire-bonded portion and two external electrical connection conductors. Next, the leadframe strip is plated with a metal layer having high conductivity and die bonding adhesion. Finally, a pre-molded structure on each of the component regions is formed to surround all the other portions of the leadframe strip with an exception of only the two external electrical connection conductors through a multiplicity of pre-molding processes, each pre-molding process molding the leadframe strip at an interval of one or more than one component regions.

The following detailed description, given by way of example and not intended to limit the invention solely to the embodiments described herein, will best be understood in conjunction with the accompanying drawings.

DETAILED DESCRIPTION OF THE PREFERRED EMBODIMENTS

The present invention discloses a method for manufacturing a pre-molding leadframe strip with compact components that is applicable to a surface-mountable electronic component, such as, but not limited to, light-emitting diodes. Reducing the distance between adjacent components increases the amount of components per unit area. Obtaining a minimum distance between adjacent components within a leadframe strip would require a multiplicity of pre-molding processes but increase materials utilization and mass production efficiency.

Figure 1A:
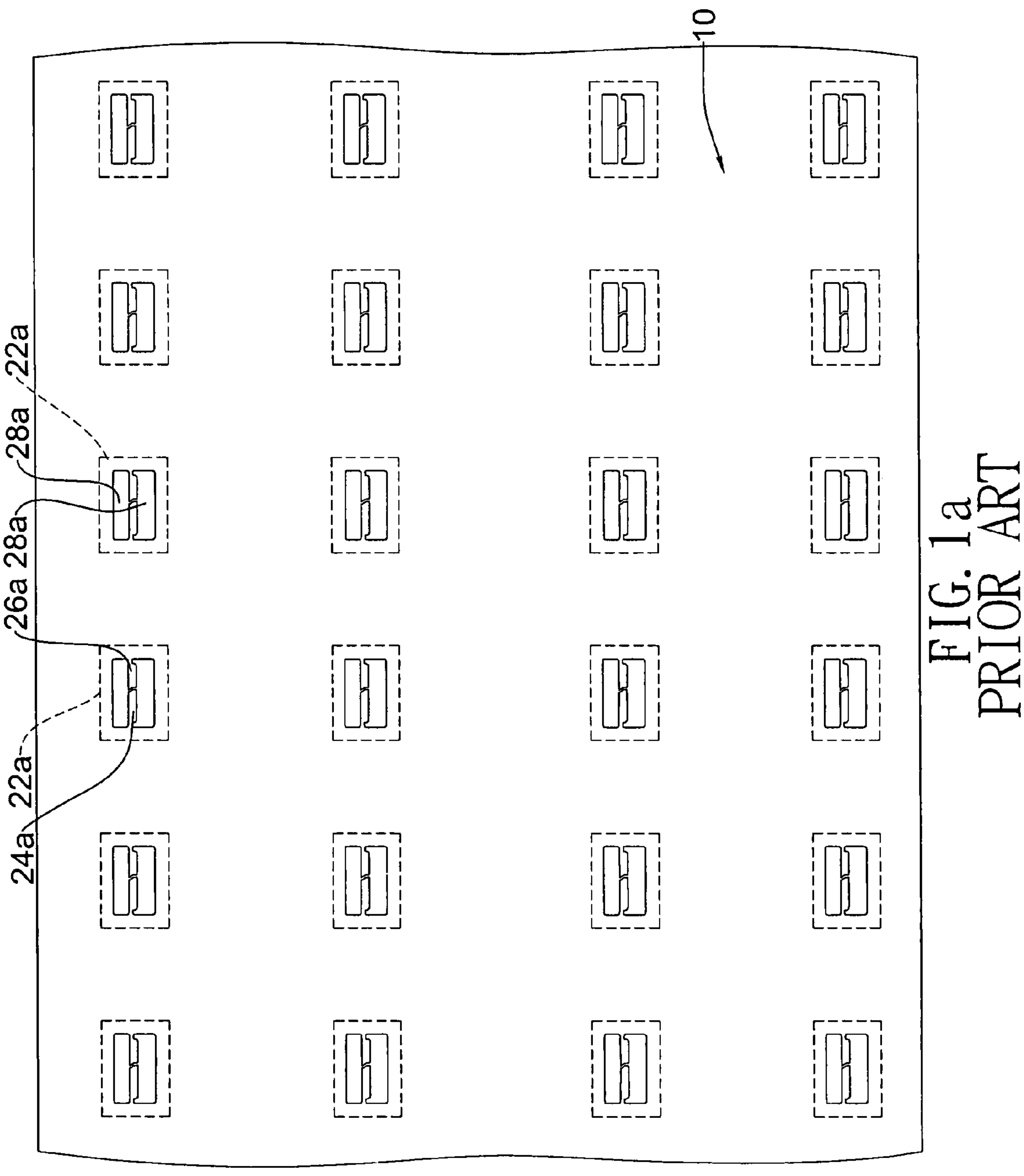
FIG. 1a PRIOR ART
FIGS. 1*a* through 1*c* are views illustrating a manufacturing process of a conventional pre-molding leadframe strip.
Figure 1B:
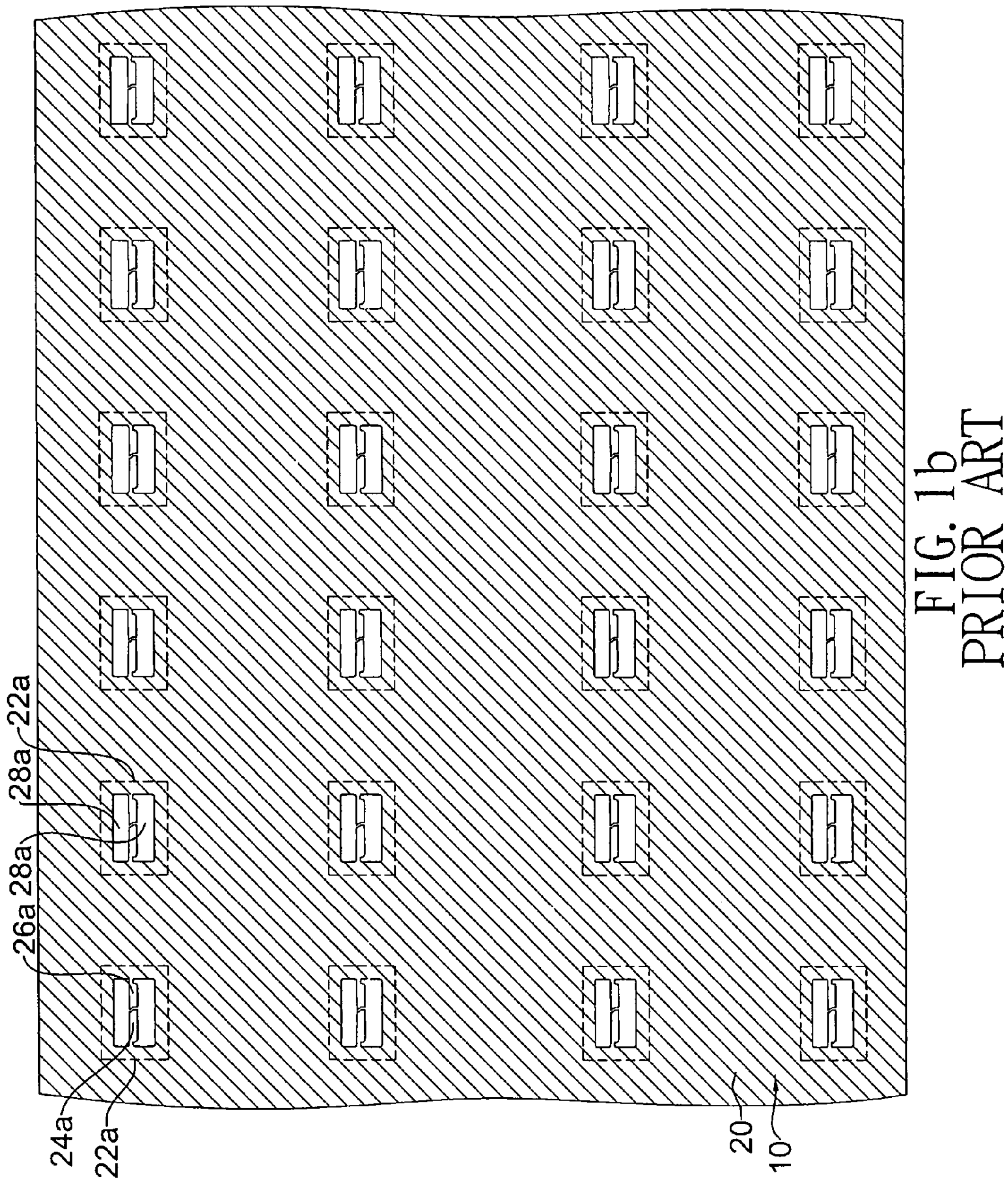
FIG. 1b PRIOR ART
Figure 1C:
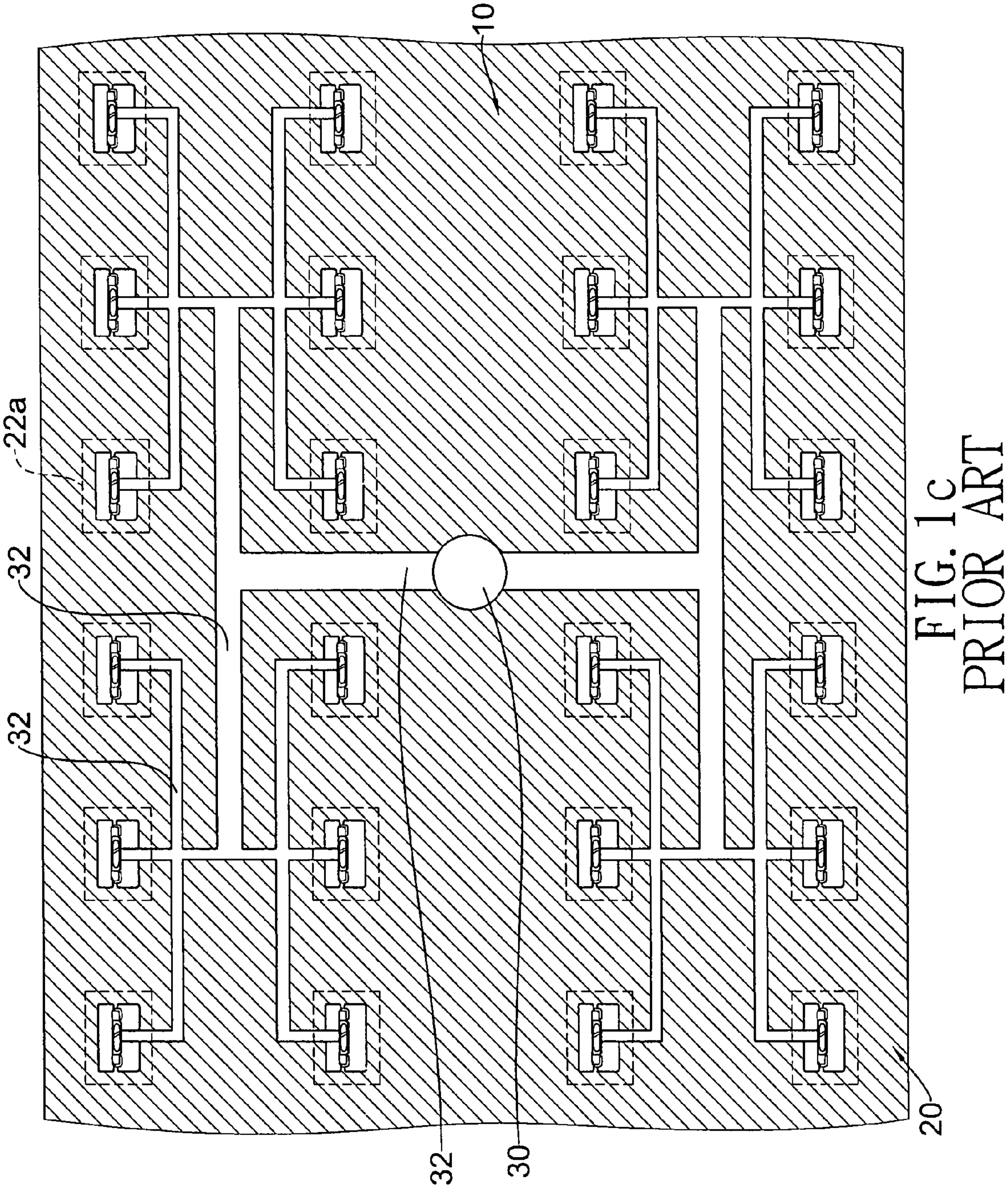
FIG. 1c PRIOR ART
Figure 2:
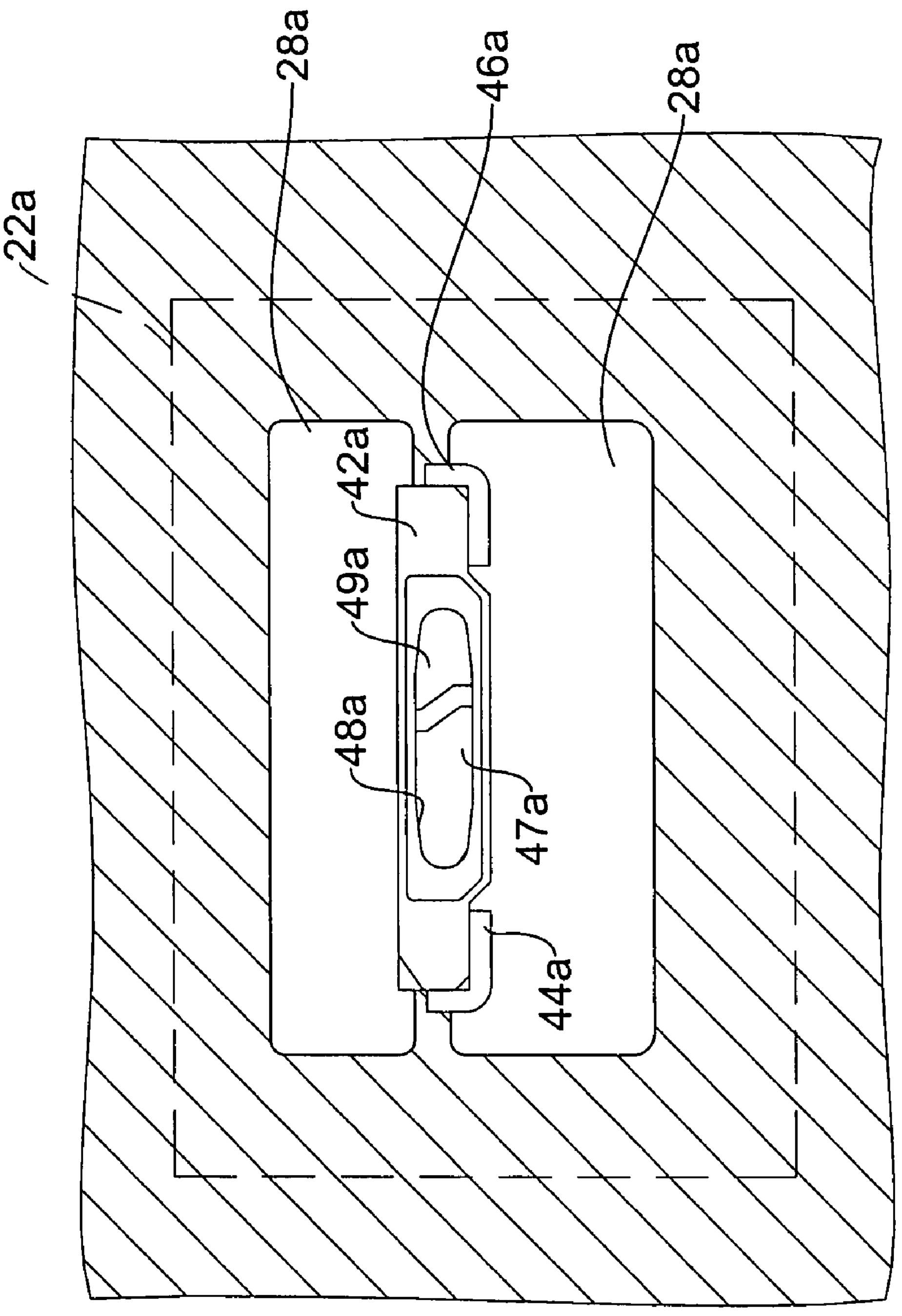
FIG. 2 PRIOR ART
FIG. 2 is a view for illustrating a detailed pre-molded structure and an end component region in FIG. 1*c*.
Figure 3:
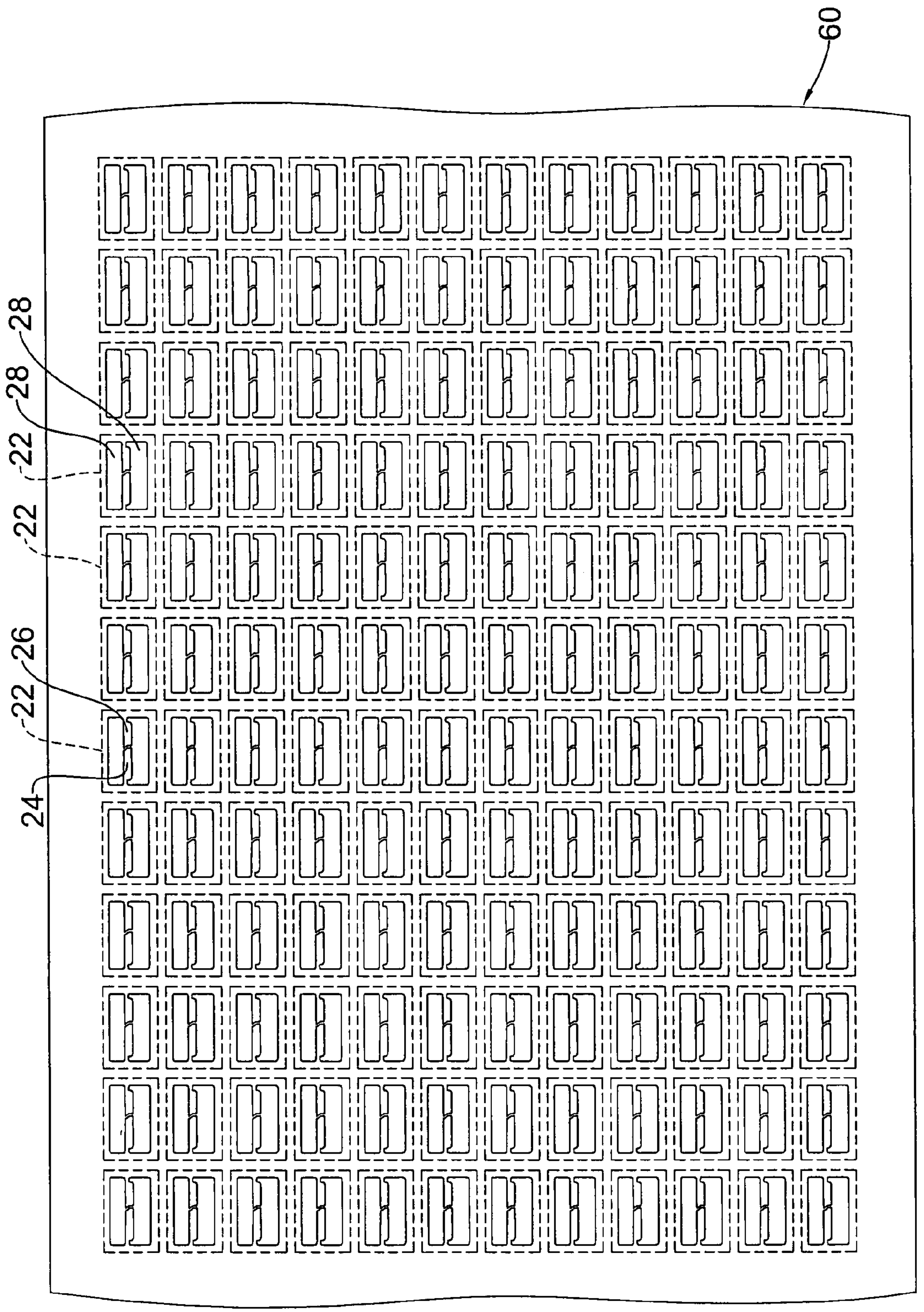
FIG. 3 is an example of a leadframe strip the present invention.

A leadframe 60 illustrated in FIG. 3 is a planar sheet and has an array of component regions 22. The leadframe strip 60 is formed to support light emitting diode chips by stamping out the leadframe strip 60 from a metal sheet or a foil. The leadframe strip 60 is a metal selected from a group consisting of iron (Fe), copper (Cu), silver (Ag), gold (Au), aluminum (Al), nickel (Ni), palladium (Pd), chromium (Cr) and alloys thereof. Each component region 22 includes two metal parts used to mount a light-emitting diode chip thereon, as a chip-attached portion 47, a wire-bonded portion 49 and external electrical connection conductors (electrode portions) as well as two empty spaces 28.

Figure 4:
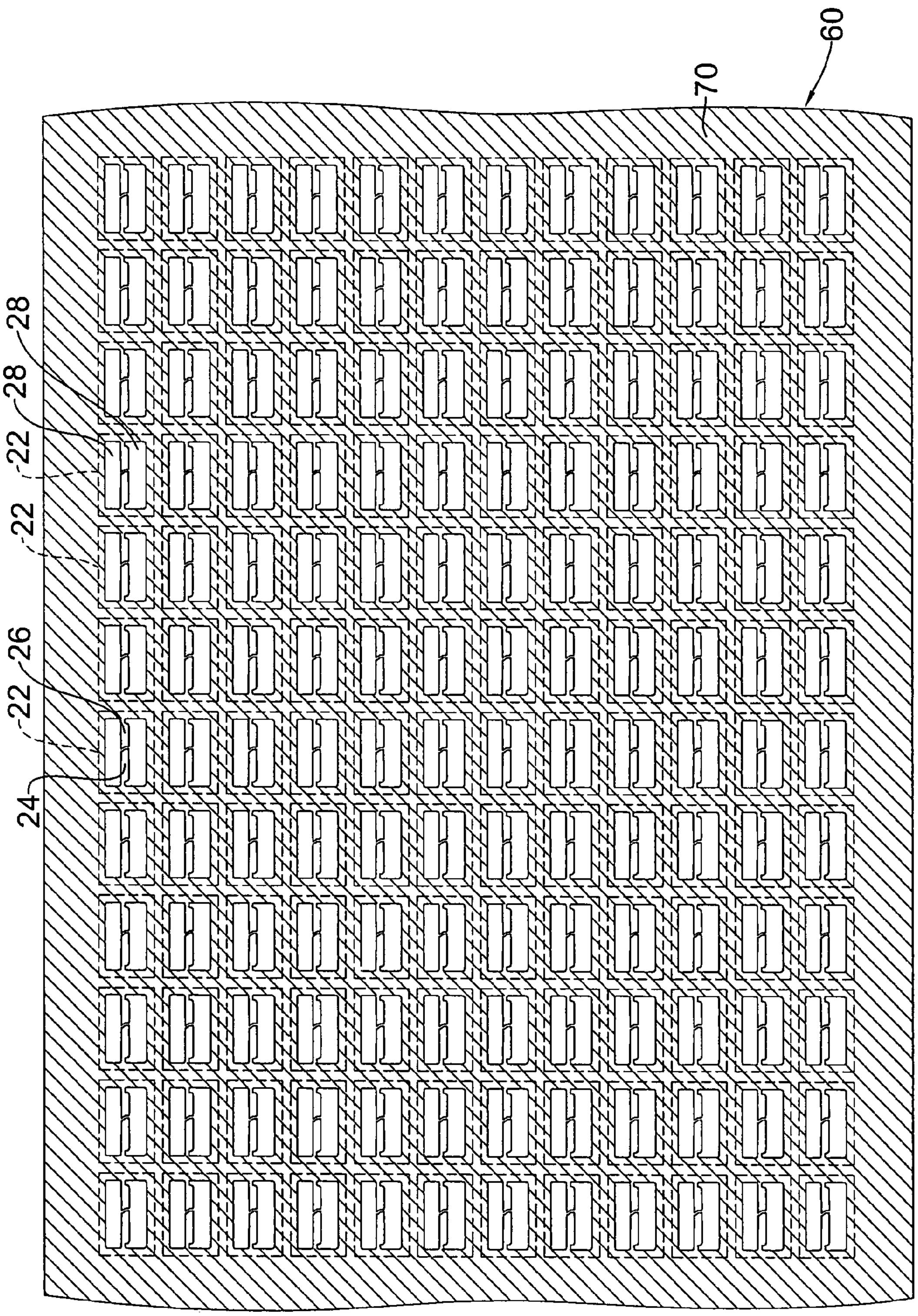
FIG. 4 is an example of the leadframe strip in FIG. 3 after being plated.

The leadframe strip 60 is then plated with a metal layer 70 having high conductivity and die bonding adhesion, as shown in FIG. 4. The plated metal layer is selected from a group consisting of Cu, Ag, Au, Ni, Pd and alloys thereof.

Figure 5A:
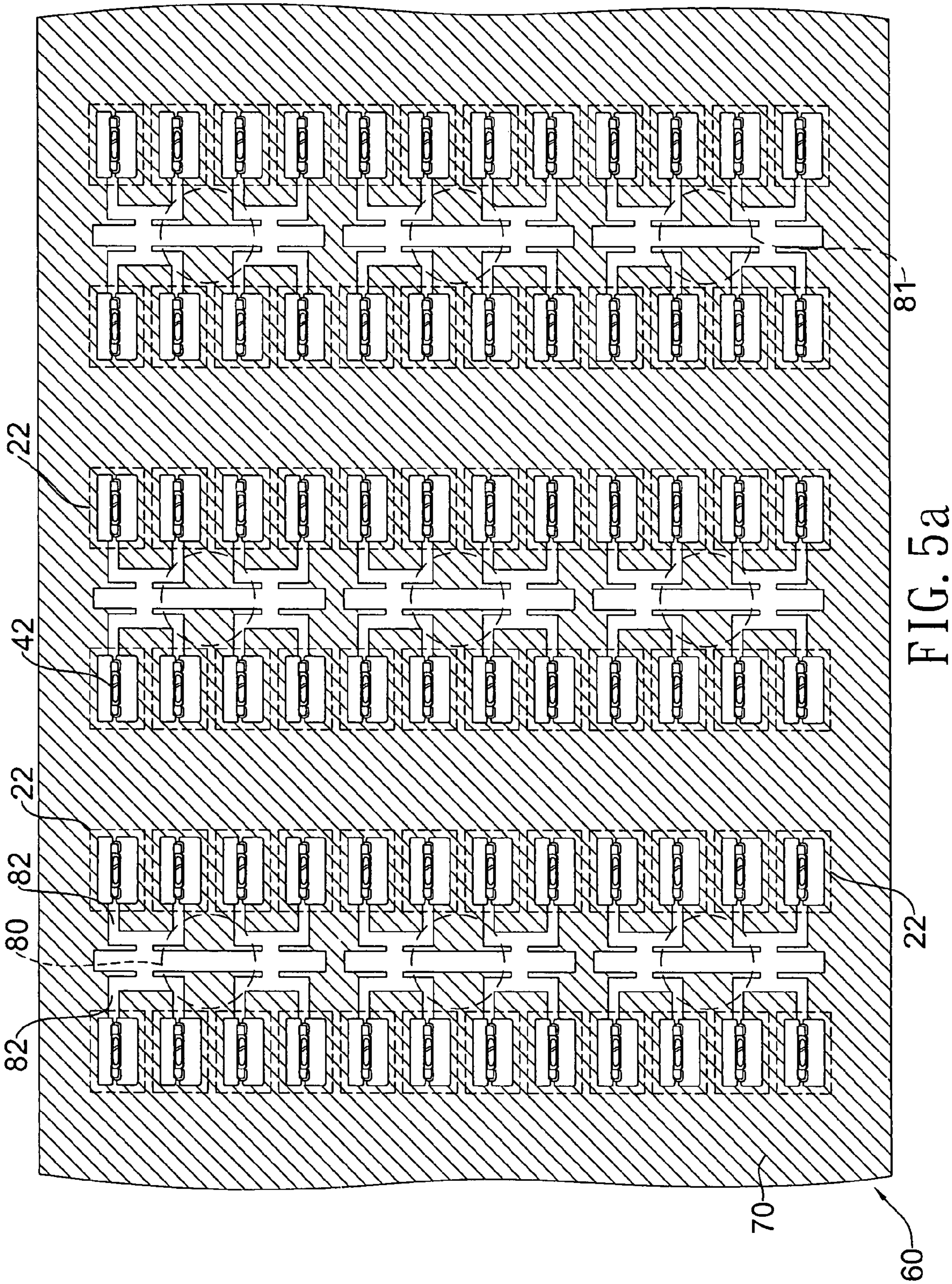
FIGS. 5 and 6 are views illustrating a primary embodiment of a multiplicity of pre-molding processes in accordance with the present invention.
Figure 7:
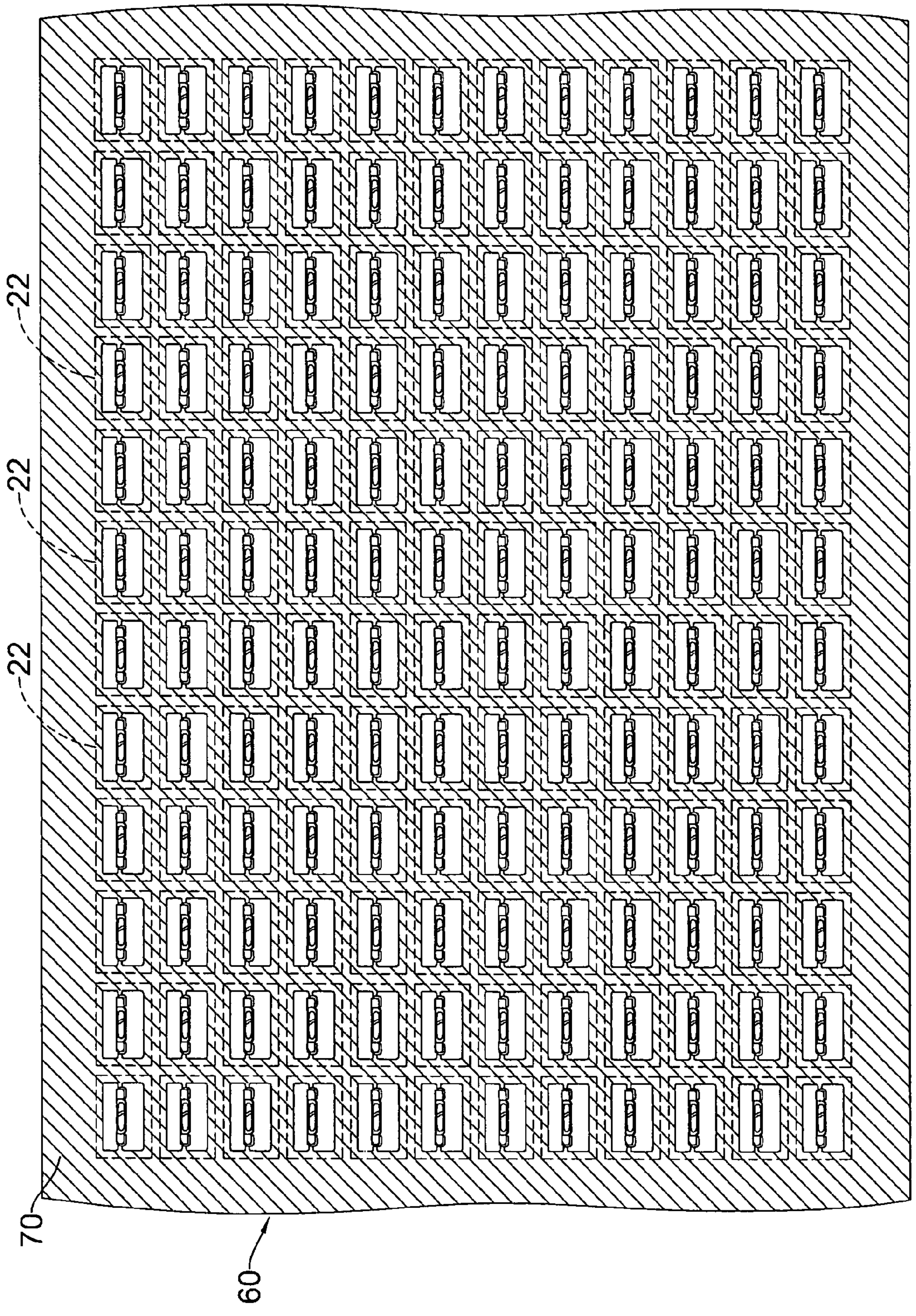
FIG. 7 is a view for illustrating a resulted layout of the leadframe strip in FIG. 3, after a step of forming a non-conductive housing.

Next, an array of pre-molded structures 42 are formed to respectively surround portions of the component regions 22 of the leadframe strip 60 with an exception of only electrode portions to be used as the external lead electrodes through a multiplicity of pre-molding processes, as shown in FIG. 5*a*. Each pre-molding process illustrated in FIG. 5*a* is used for molding the leadframe strip 60 at an interval of one component region 22. Thus, two pre-molding processes are required for completing pre-molding the leadframe strip 60 at the interval of one component region 22. For example, a first pre-molding process is implemented to process the component regions 22 in odd columns such as first, third, fifth and seventh columns, etc. Then, a second pre-molding process is implemented to process the component regions 22 in even columns such as second, fourth, sixth and eighth columns, etc. The resultant layout of the leadframe strip 60 after completing pre-molding can be seen in FIG. 7. A molding material used at the pre-molding process is made of non-light-transmittable plastic.

In order to upgrade the quality of the pre-molding structures and efficiently utilize the molding material, the present invention introduces hot runners into the pre-molding process.

The pre-molding process of the present invention is a multiplicity of pre-molding and hot runner processes and implemented with hot runners 80, as shown in FIG. 5. Each hot runner 80 has multiple forked runners 82.

Figure 5B:
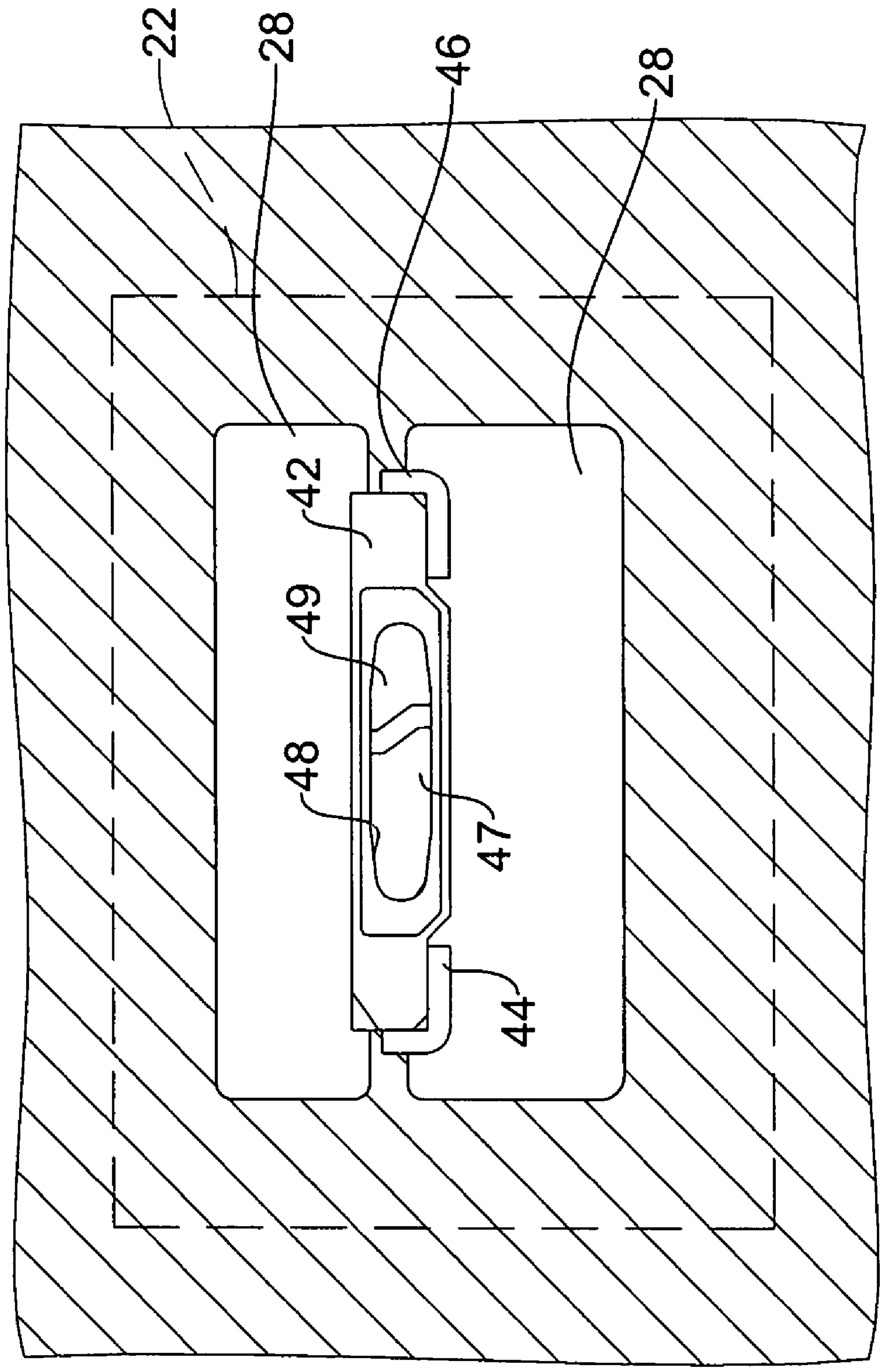
Figure 6:
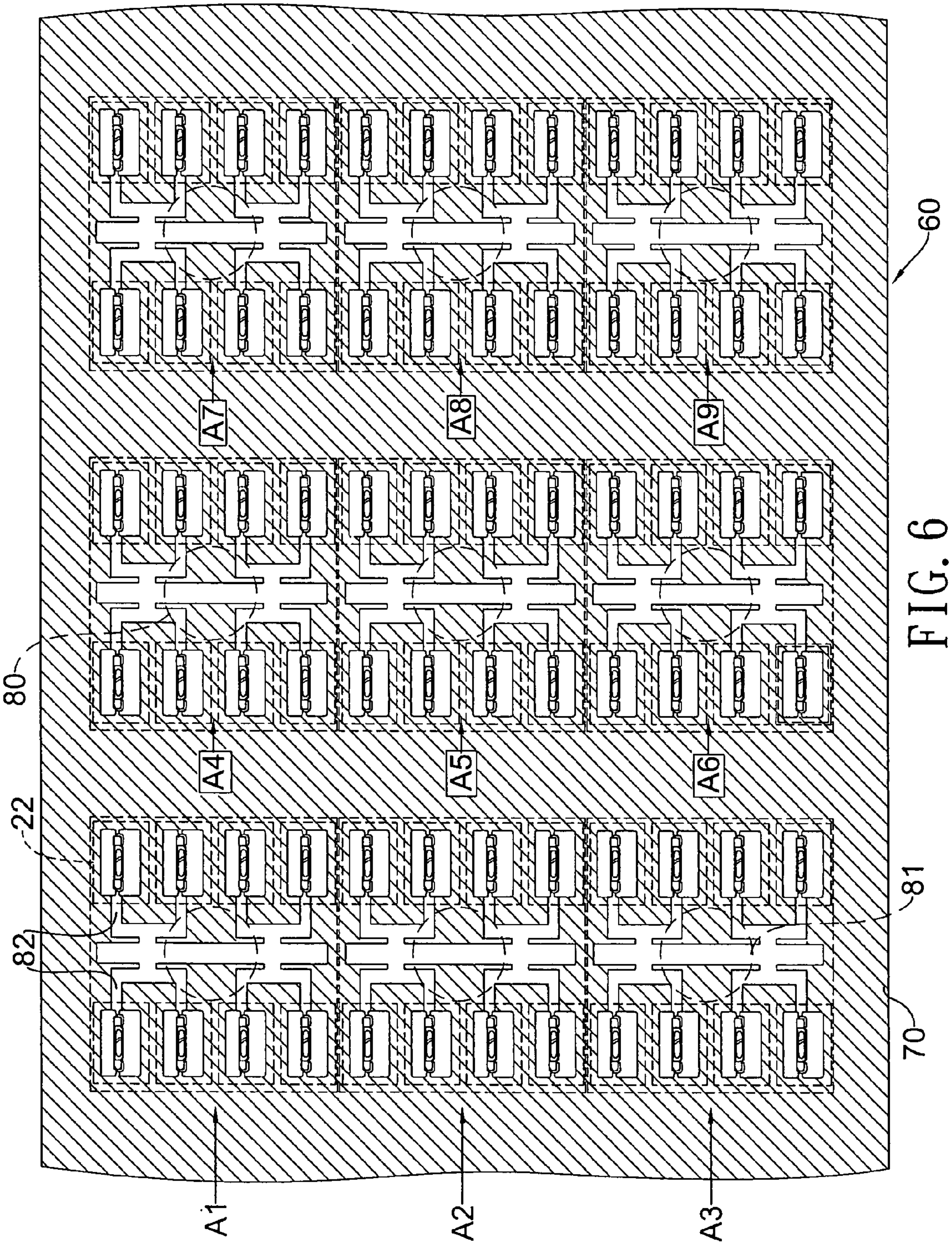

Furthermore, each of the hot runners 80 of one of the pre-molding processes can possess a temperature, as shown in FIG. 6. Nine hot runners 80 are used in the pre-molding process of FIG. 5, and these nine hot runners 80 can be separated into A1 through A9, nine temperature regions. The range of processing temperature of each of the temperature regions depends on a type of molding compounds, generally between 150-400° C. Therefore, with the manipulation of the temperature regions A1-A9, a better yield of pre-molding products can be achieved via adjusting the temperature of each hot runner 80.

Likewise, each of the pre-molded structures 42 formed by the process of the present invention is also in the form of polyhedron having an inner cavity to easily mount a desirable target therein, in which a surface facing the component region 22 is opened. The detailed pre-molded structures 42 and the resultant component region 22 are also shown in FIG. 5*b*. The finished component region 22 includes a function area 48 composed of the chip-attached portion 47 and the wire-bonded portion 49, the pre-molded structures 42, the empty spaces 28 and two exposed external electrode portions 44 and 46. The external electrode portions 44 and 46 of the component region 22 will then be folded to make mountable electrode structures during subsequent packaging processes.

Figure 8:
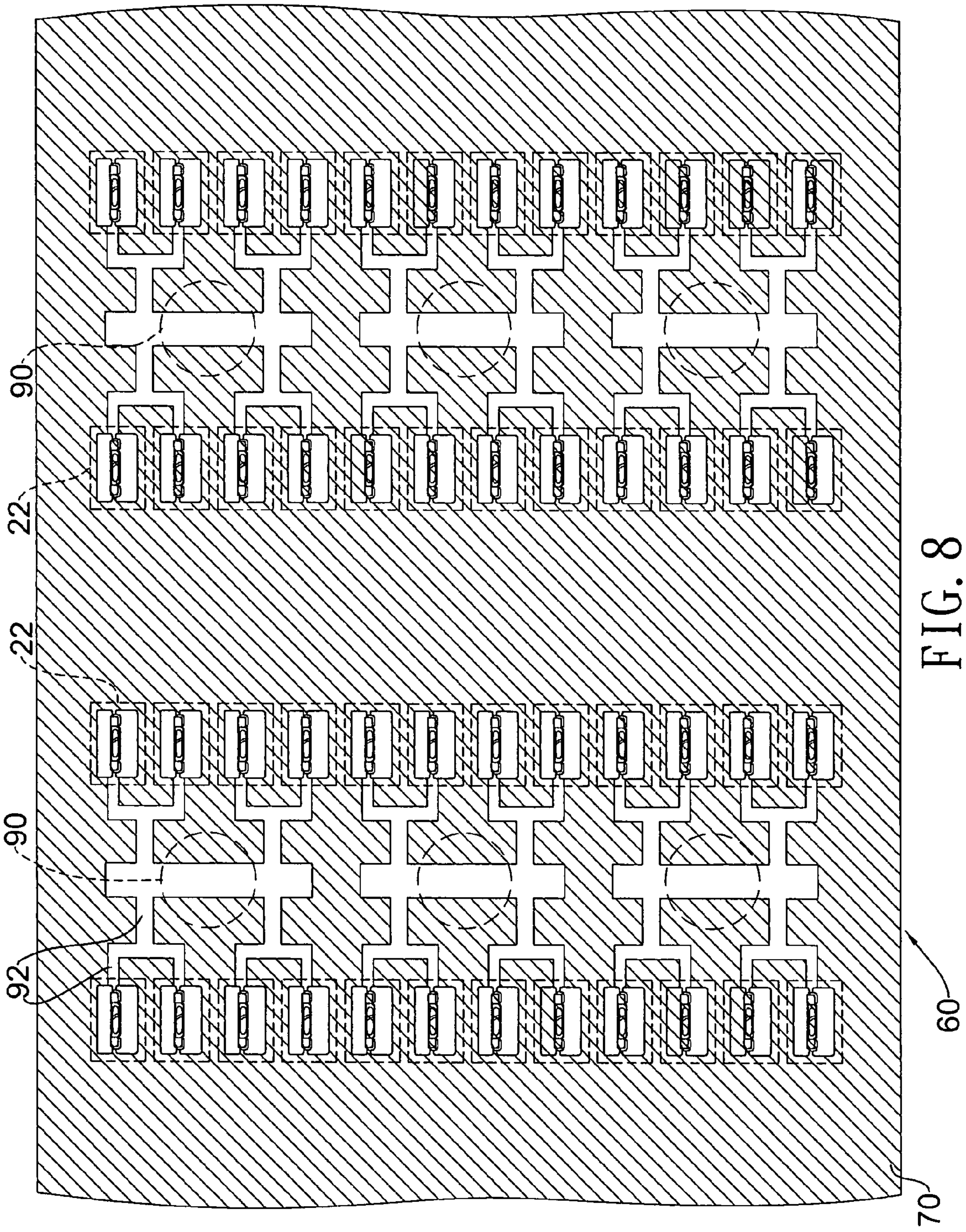
FIGS. 8 and 9 are views illustrating another multiplicity of pre-molding processes in accordance with the present invention.

Alternatively, each of the multiplicity of pre-molding processes of the present invention used for molding the leadframe strip 60 can be at an interval of two component regions 22. Thus, three pre-molding processes are required for completing pre-molding the leadframe strip 60 at the interval of two component regions 22. The resultant layout of the leadframe strip 60 after completing pre-molding can be seen in FIG. 7. The alteration of another multiplicity of pre-molding processes is shown in FIG. 8. Each of the pre-molding process in this alteration is implemented with hot runners 90, as shown in FIG. 8. Each hot runner 90 has multiple forked runners 92.

Figure 9:
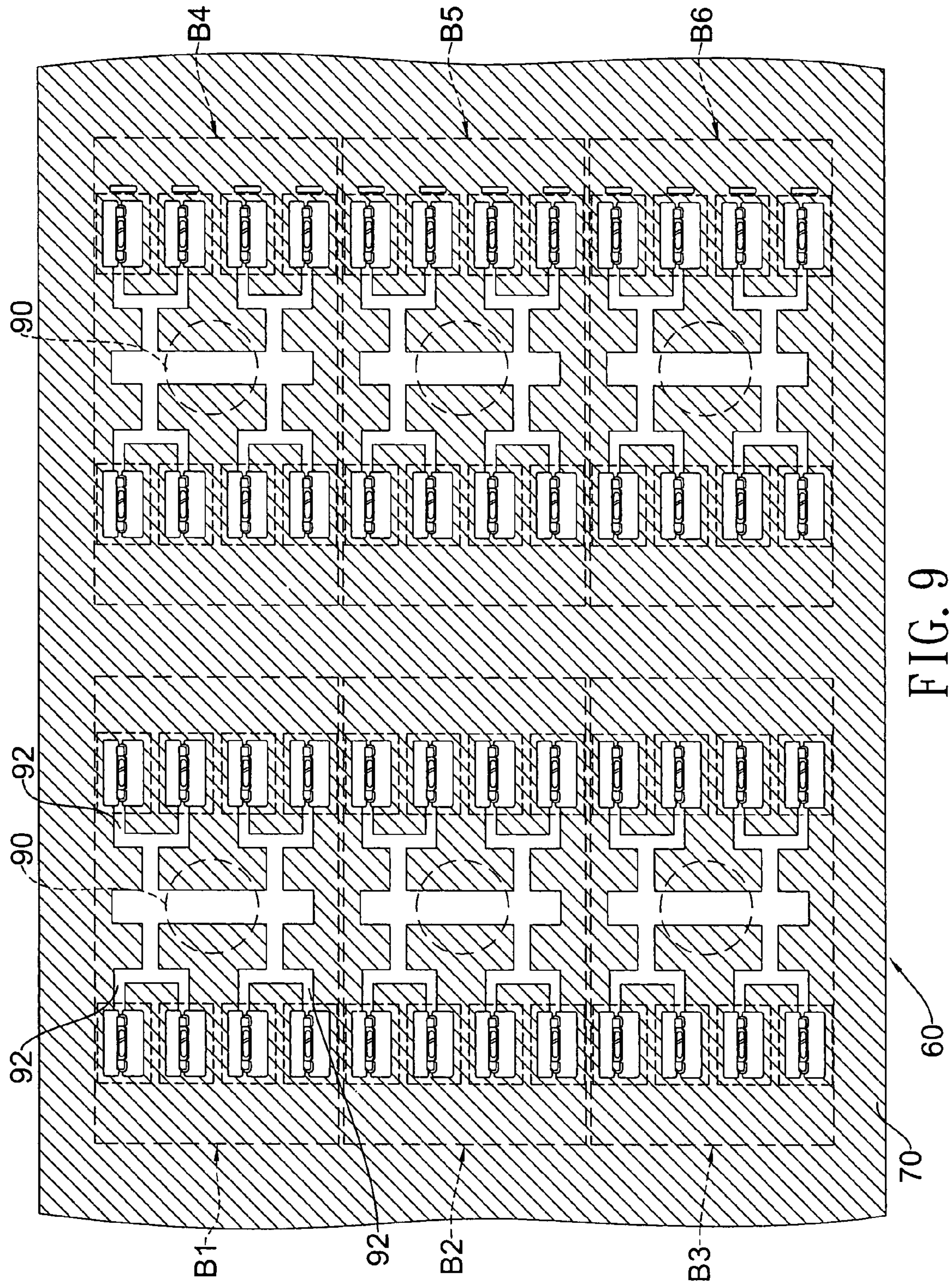

Likewise, each of the hot runners 90 of one of the pre-molding processes also can possess its own temperature, as shown in FIG. 9. Six hot runners 90 are used in the pre-molding process of FIG. 8, and these six hot runners 90 can be separated into B1 through B6, six temperature regions.

Figure 10:
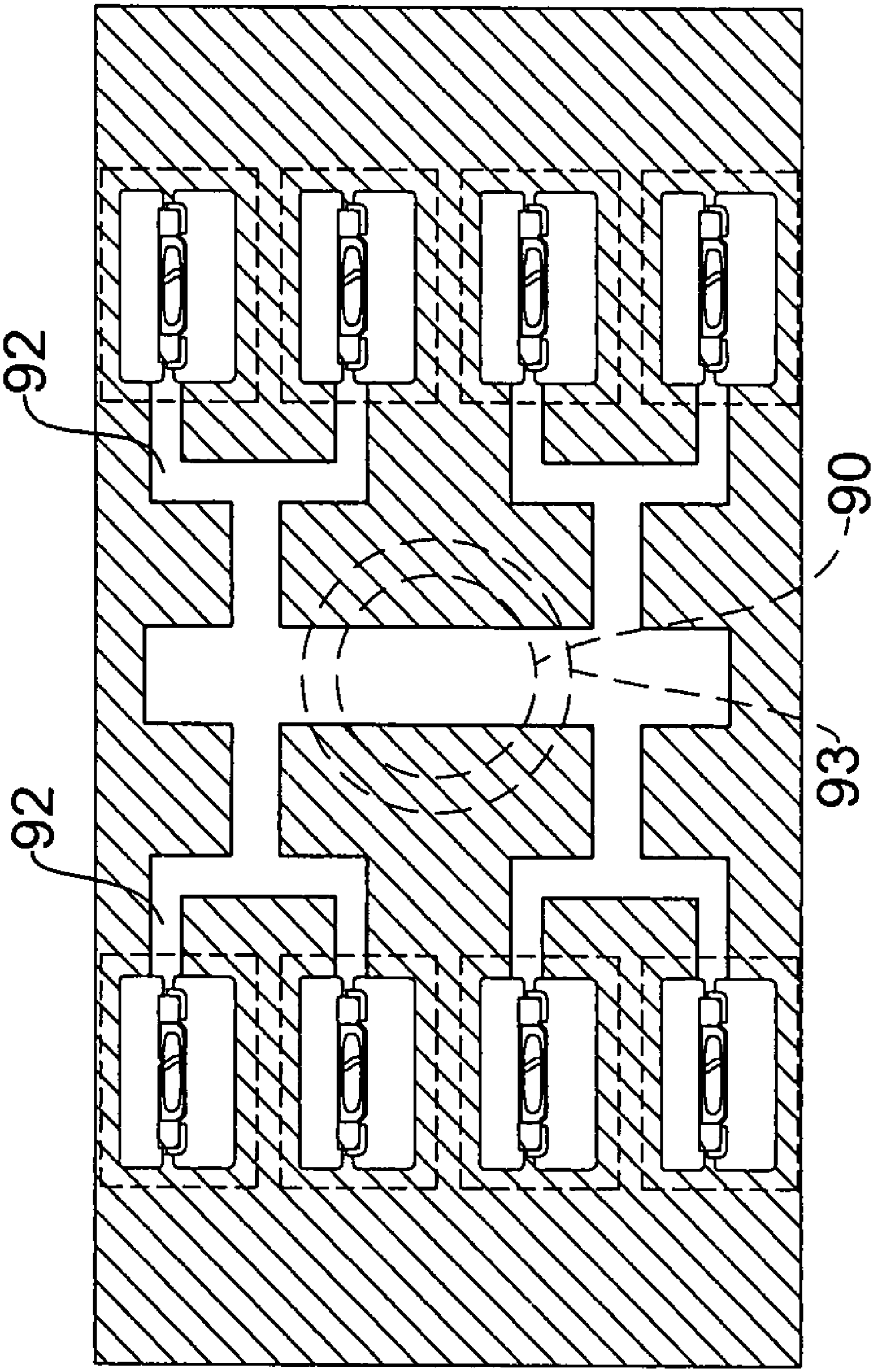
FIG. 10 is an enlarged view illustrating that a heating device is mounted around the hot runner in FIG. 8.

With reference to FIG. 10, each runner hot runner 90 may further have a heating device 93 mounted around and contacting the hot runner 90 to keep the forked runners 92 in a desired temperature range that maintains the molding material in the forked runner 92 in a melted state. The heating device 93 prevents the melted molding material in the forked runners 93 from unexpectedly cooling down and solidifying before the molding material is injected on the leadframe strip 60 due to non-uniform heat distribution of the forked runners 92. Therefore, a defect rate of the finished component regions 22 on the leadframe strip 60 is effectively lowered.

Compared to the conventional method, the present invention has several advantages. First, the embodiments enable the leadframe to be produced simply and cost-effectively by stamping out the leadframe from a metal sheet or a foil. Second, since the density of the component regions is maximized, materials utilization and mass production efficiency are dramatically higher than the conventional method. Finally, due to the manipulation of the temperature of each hot runner, an improved yield of the pre-molding products can be achieved.

What is claimed is:

1. A method for manufacturing a pre-molding leadframe strip with compact components, applicable to light-emitting diode components, comprising the steps of:

forming a leadframe strip with an array of component regions, each component region including two metal parts for using as a chip-attached portion, a wire-bonded portion and two external electrical connection conductors; and forming a pre-molded structure on each of the component regions to surround portions of the component region on the leadframe strip with an exception of only the two external electrical connection conductors through a multiplicity of pre-molding processes;

wherein the array has multiple first columns and multiple second columns arranged alternately, and the multiplicity of the pre-molding processes has a first pre-molding process implemented to process the component regions in first columns of the array, wherein adjacent first columns are at an interval of at least one component region; and a second pre-molding process implemented to process the component regions in second columns of the array, wherein adjacent second columns are at an interval of at least one component region.

2. The method for manufacturing a pre-molding leadframe strip with compact components as recited in claim 1, further comprising a step of plating the leadframe strip with a metal layer having conductivity and die bonding adhesion.

3. The method for manufacturing a pre-molding leadframe strip with compact components as recited in claim 1, wherein a metal of the leadframe is selected from a group consisting of iron (Fe), copper (Cu), silver (Ag), gold (Au), aluminum (Al), nickel (Ni), palladium (Pd), chromium (Cr) and a combination thereof.

4. The method for manufacturing a pre-molding leadframe strip with compact components as recited in claim 1, wherein forming the array of component regions is by stamping out the leadframe strip.

5. The method for manufacturing a pre-molding leadframe strip with compact components as recited in claim 2, wherein a metal of the plated metal layer is selected from a group consisting of Cu, Ag, Au, Ni, Pd and a combination thereof.

6. The method for manufacturing a pre-molding leadframe strip with compact components as recited in claim 1, wherein a molding material used at the pre-molding process is made of non-light-transmittable plastic.

7. The method for manufacturing a pre-molding leadframe strip with compact components as recited in claim 1, wherein the step of forming the pre-molded structure further comprises introducing hot runners into the pre-molding process.

8. The method for manufacturing a pre-molding leadframe strip with compact components as recited in claim 7, wherein the hot runners are separated into different temperature regions.

9. The method for manufacturing a pre-molding leadframe strip with compact components as recited in claim 8, wherein each of the temperature regions is within a range between 150 and 400° C.

10. The method for manufacturing a pre-molding leadframe strip with compact components as recited in claim 7, wherein each hot runner has a heating device mounted around and contacting the hot runner.

* * * * *